United States Patent
Wong

(10) Patent No.: US 7,151,292 B1
(45) Date of Patent: Dec. 19, 2006

(54) DIELECTRIC MEMORY CELL STRUCTURE WITH COUNTER DOPED CHANNEL REGION

(75) Inventor: Nga-Ching Wong, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/342,549

(22) Filed: Jan. 15, 2003

(51) Int. Cl.
H01L 29/76 (2006.01)

(52) U.S. Cl. ............... 257/314; 257/315; 257/E29.309

(58) Field of Classification Search ........ 257/410–413, 257/314, 321–322, 336, 344; 438/261, 287, 438/216, 585, 586–587, 591, 593, 594, 376, 438/398–399; 365/200

See application file for complete search history.

(56) References Cited

U.S. PATENT DOCUMENTS

| | | | | |
|---|---|---|---|---|
| 4,053,798 A * | 10/1977 | Koike et al. | ................. | 365/159 |
| 4,353,083 A * | 10/1982 | Trudel et al. | ................. | 257/326 |
| 5,471,423 A * | 11/1995 | Iwasa | ..................... | 365/185.01 |
| 5,789,776 A * | 8/1998 | Lancaster et al. | ........... | 257/296 |
| 5,814,854 A * | 9/1998 | Liu et al. | ...................... | 257/315 |
| 5,851,844 A * | 12/1998 | Ooms et al. | ..................... | 438/3 |
| 6,011,725 A * | 1/2000 | Eitan | ...................... | 365/185.33 |
| 6,030,871 A * | 2/2000 | Eitan | ........................... | 438/276 |
| 6,048,770 A * | 4/2000 | Sakakibara | ................. | 438/291 |
| 6,107,126 A * | 8/2000 | Wu | ............................. | 438/217 |
| 6,140,676 A * | 10/2000 | Lancaster | .................... | 257/315 |
| 6,215,148 B1 * | 4/2001 | Eitan | ........................... | 257/316 |
| 6,222,224 B1 * | 4/2001 | Shigyo | ........................ | 257/315 |
| 6,228,725 B1 * | 5/2001 | Nandakumar et al. | ...... | 438/289 |
| 6,274,894 B1 * | 8/2001 | Wieczorek et al. | ......... | 257/192 |
| 6,301,155 B1 * | 10/2001 | Fujiwara | ................ | 365/185.18 |
| 6,313,503 B1 * | 11/2001 | Lee et al. | .................... | 257/324 |
| 6,348,711 B1 * | 2/2002 | Eitan | ........................... | 257/316 |
| 6,351,428 B1 * | 2/2002 | Forbes | ................... | 365/230.06 |
| 6,368,915 B1 * | 4/2002 | Montree et al. | ............ | 438/257 |
| 6,417,550 B1 * | 7/2002 | Madurawe et al. | ......... | 257/408 |
| 6,429,063 B1 * | 8/2002 | Eitan | ........................... | 438/232 |
| 6,469,347 B1 * | 10/2002 | Oda et al. | .................... | 257/345 |
| 6,479,862 B1 * | 11/2002 | King et al. | ................. | 257/321 |
| 6,496,347 B1 * | 12/2002 | Christensen et al. | ........ | 361/115 |
| 6,566,203 B1 * | 5/2003 | Chang et al. | ................ | 438/275 |
| 6,567,292 B1 * | 5/2003 | King | ........................... | 365/71 |
| 6,605,961 B1 * | 8/2003 | Forbes | ........................ | 326/41 |
| 6,649,972 B1 * | 11/2003 | Eitan | ........................... | 257/324 |
| 6,713,812 B1 * | 3/2004 | Hoefler et al. | .............. | 257/316 |
| 6,730,960 B1 * | 5/2004 | Forbes | ........................ | 257/321 |
| 6,735,115 B1 * | 5/2004 | Hsu et al. | .............. | 365/185.11 |
| 6,812,084 B1 * | 11/2004 | King | ........................... | 438/217 |
| 6,833,297 B1 * | 12/2004 | Fastow et al. | .............. | 438/217 |
| 6,891,235 B1 * | 5/2005 | Furukawa et al. | .......... | 257/408 |

(Continued)

Primary Examiner—Thao X. Le
(74) Attorney, Agent, or Firm—Renner, Otto, Boisselle & Sklar LLP

(57) ABSTRACT

A charge trapping dielectric memory cell array comprises a plurality of parallel bit lines implanted within the lightly doped substrate. The parallel bit lines define a plurality of channel regions spaced there between and form a semiconductor junction there with. A plurality of parallel and spaced apart word lines are positioned above the surface of the substrate and separated from the substrate by a charge trapping dielectric. The plurality of parallel word lines are perpendicularly positioned with respect to the bit lines. Each channel region comprises a central counter doped channel region adjacent to a top surface of the substrate and vertically extending into the channel region to a depth less than the bit line depth and being spaced from each semiconductor junction by a pocket region.

20 Claims, 6 Drawing Sheets

U.S. PATENT DOCUMENTS

| | | | |
|---|---|---|---|
| 6,971,234 B1* | 12/2005 | Phanco et al. | 60/484 |
| 2002/0089877 A1* | 7/2002 | Yi et al. | 365/185.24 |
| 2002/0105023 A1* | 8/2002 | Kuo et al. | 257/318 |
| 2002/0182829 A1* | 12/2002 | Chen | 438/514 |
| 2003/0081460 A1* | 5/2003 | Choi et al. | 365/185.29 |
| 2003/0123307 A1* | 7/2003 | Lee et al. | 365/200 |
| 2003/0148583 A1* | 8/2003 | Adachi et al. | 438/257 |
| 2003/0161192 A1* | 8/2003 | Kobayashi et al. | 365/200 |
| 2004/0070030 A1* | 4/2004 | Chindalore et al. | 257/336 |

* cited by examiner

DIELECTRIC MEMORY CELL STRUCTURE WITH COUNTER DOPED CHANNEL REGION

TECHNICAL FIELD

The present invention relates generally to flash memory cell devices and more specifically, to improvements in dielectric memory cell structures for dual bit storage and a process for making the improved dielectric memory cell structure.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV Si—$SiO_2$ energy barrier between the channel region and the tunnel oxide. While the electrons are accelerated towards the drain, those electrons which collide with the crystalline lattice are re-directed towards the Si—$SiO_2$ interface under the influence of the control gate electrical field and gain sufficient energy to cross the barrier.

Once programmed, the negative charge on the floating gate increases the threshold voltage of the FET characterized by the source region, drain region, channel region, and control gate. During a "read" of the memory cell, the magnitude of the current flowing between the source and drain at a predetermined control gate voltage indicates whether the flash cell is programmed.

More recently charge trapping dielectric memory cell structures have been developed. A conventional dielectric memory cell 10 is shown in cross section in FIG. 1 and is characterized by a vertical stack of an insulating tunnel layer 12, a charge trapping dielectric layer 14, an insulating top oxide layer 16, and a polysilicon control gate 18 positioned on top of a crystalline silicon substrate 15. Within the substrate 15 are a channel region 17 positioned below the vertical stack and source diffusion 19 and drain diffusion 23 on opposing sides of the channel region 17. This particular structure of a silicon channel region 22, tunnel oxide 12, nitride 14, top oxide 16, and polysilicon control gate 18 is can be generically referred to as a SONOS device.

Similar to the floating gate device, the charge trapping dielectric memory cell 10 is programmed by inducing hot electron injection from the channel region 17 to the nitride layer 14 to create a non volatile negative charge within charge traps existing in the nitride layer 14. Again, hot electron injection can be achieved by applying a drain-to-source bias along with a high positive voltage on the control gate 18. The high voltage on the control gate 18 inverts the channel region 17 while the drain-to-source bias accelerates electrons towards the drain region 23. The accelerated electrons gain 5.0 to 6.0 eV of kinetic energy which is more than sufficient to cross the 3.2 eV Si—$SiO_2$ energy barrier between the channel region 17 and the tunnel oxide 12. While the electrons are accelerated towards the drain region 23, those electrons which collide with the crystalline lattice are re-directed towards the Si—$SiO_2$ interface under the influence of the control gate electrical field and have sufficient energy to cross the barrier. Because the nitride layer stores the injected electrons within traps and is otherwise a dielectric, the trapped electrons remain localized within a drain charge storage region 13 that is close to the drain region 23 (or in a source charge storage region 11 that is close to the source region 19 if a source to drain bias is used) from which the electrons were injected. As such, the charge trapping dielectric memory device can be used to store two bits of data, one in each of the charge storage regions 11 and 13, per cell and are typically referred to as dual bit charge trapping dielectric memory device.

A problem associated with dual bit charge trapping dielectric memory structures is that the trapped charge in the drain and source charge storage regions 13 and 11 has a finite spatial distribution that peaks at the drain region 23 and source region 19 respectively and a portion of the charge distribution will spread into the area between the source charge storage region 11 and the drain charge storage region 13. The spread charge effects the threshold voltage during the read cycle. The charge that accumulates between the source charge storage region 11 and the drain charge storage region 13 is difficult to remove utilizing the hot hole injection erase mechanism. Additionally, charge spreading become more problematic over the lifetime of operation of the device. Each program/erase cycle, may cause further spread of electrons into the area between source charge storage region 11 and the drain charge storage region 13. The problem is further compounded by the continued decrease in the size of the semiconductor devices, which calls for nitride layers with less area separating the two charge storage regions 11 and 13. Consequently, a need exists in the art for a dual bit charge trapping dielectric memory cell structure which does not suffer the disadvantages discussed above.

SUMMARY OF THE INVENTION

A first aspect of the present invention is to provide a charge trapping dielectric memory cell array. The array comprises a lightly doped substrate of a first semiconductor conductivity with a plurality of parallel bit lines implanted therein to a bit line depth. Each of the plurality of parallel bit lines is of a second semiconductor conductivity and the plurality of parallel bit lines define a plurality of channel regions spaced there between. Each interface between a bit line and a channel region forms a semiconductor junction. A plurality of parallel and spaced apart word lines are positioned above the surface of the substrate and separated from the substrate by a charge trapping dielectric. The word lines are perpendicularly positioned with respect to the bit lines. Each channel region comprises a central counter doped channel region adjacent to a top surface of the substrate and vertically extending into the channel region to a depth less than the bit line depth and being spaced from each semiconductor junction by a pocket region of the first semiconductor conductivity. Each pocket region may have a doping concentration greater than the doping concentration of the lightly doped substrate.

The charge trapping dielectric extends across the entire surface of the dielectric memory cell array over both each bit line and each channel region. The charge trapping dielectric may comprise a tunnel layer of a first dielectric material, a charge trapping layer comprising a dielectric material with charge trapping properties, and a top dielectric of a second dielectric material. The tunnel layer is adjacent to the top surface of the substrate. The charge trapping layer is adjacent to the tunnel layer and spaced from the top surface of the substrate by the tunnel layer. And, the top layer is adjacent to the charge trapping layer and the word lines.

The charge trapping layer may comprise a nitride compound with a thickness range from about 20 angstroms to 100 angstroms in thickness. More specifically, the charge trapping layer may comprise a nitride compound selected from the group consisting of $Si_3N_4$ and $SiO_xN_4$.

A second aspect of the present invention is to provide a dual bit dielectric memory cell useful for forming a dielectric memory cell array. The dual bit dielectric memory cell comprises a semiconductor substrate. The semiconductor substrate comprises a channel region lightly implanted with a first conductivity impurity and a source region and drain region implanted to a bit line depth with a second conductivity impurity. The source region and the drain region are positioned on opposing sides of the channel region and each form a semiconductor junction with the channel region. A charge trapping dielectric is positioned on the surface of the substrate. The channel region comprises a central counter doped channel region adjacent to a top surface of the substrate and vertically extending into the channel region to a depth less than the bit line depth. The central counted doped channel region is spaced from each semiconductor junction by a pocket region of the first semiconductor conductivity. Each pocket region have a greater doping concentration than the lightly doped channel region.

The charge trapping dielectric extends across the source region, the drain region, and the channel region. The charge trapping dielectric may comprise a tunnel layer of a first dielectric material, a charge trapping layer comprising a dielectric material with charge trapping properties, and a top dielectric of a second dielectric material. The tunnel layer is adjacent to the top surface of the substrate. The charge trapping layer is adjacent to the tunnel layer and spaced from the top surface of the substrate by the tunnel layer. And, the top layer is adjacent to the charge trapping layer and the word lines.

The charge trapping layer may comprise a nitride compound with a thickness range from about 20 angstroms to 100 angstroms in thickness. More specifically, the charge trapping layer may comprise a nitride compound selected from the group consisting of $Si_3N_4$ and $SiO_xN_4$.

For a better understanding of the present invention, together with other and further aspects thereof, reference is made to the following description, taken in conjunction with the accompanying drawings. The scope of the invention is set forth in the appended clams.

BRIEF DESCRIPTION OF THE DRAWINGS

FIG. 3 is a flow chart showing exemplary steps for fabricating the dielectric memory cell array of FIG. 2a;

DESCRIPTION OF THE PREFERRED EMBODIMENTS

Figure 1:
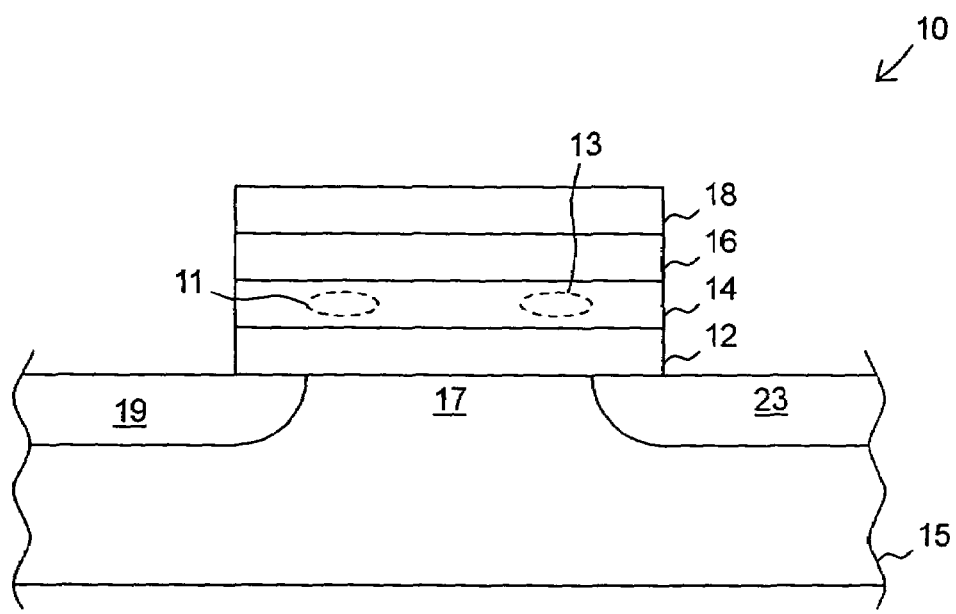
FIG. 1 is a schematic, cross sectional view of a dielectric memory cell in accordance with the prior art.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2A:
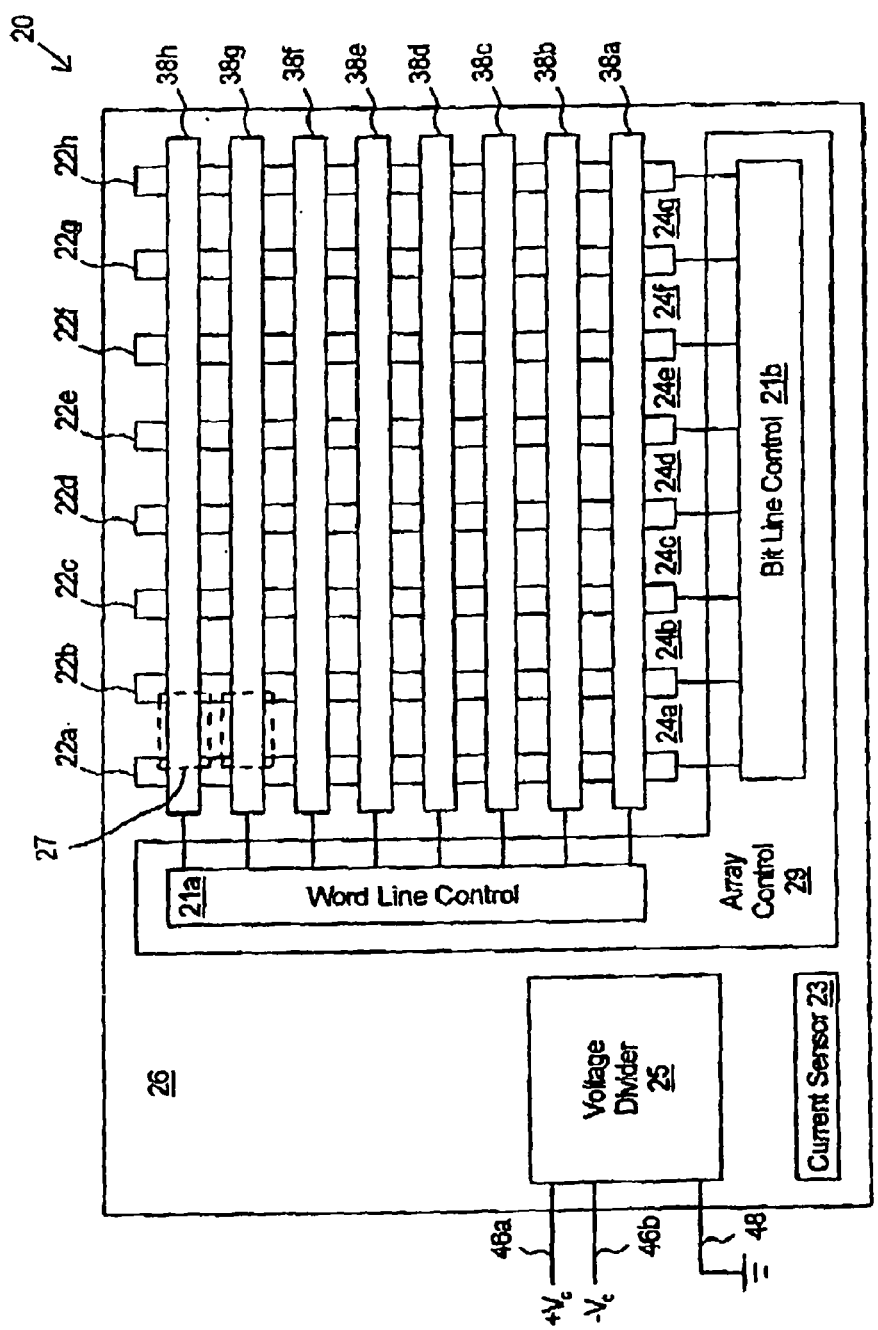
FIG. 2a is a plan view of a dielectric memory cell array in accordance with one embodiment of this invention.

FIG. 2a shows an exemplary embodiment of a dual bit dielectric memory cell array 20 in block diagram form. The array 20 comprises a plurality of dual bit dielectric memory cells 27, an array control circuit 29, and a current sense circuit 23 fabricated on a crystalline semiconductor substrate 26.

The array 20 of dual bit dielectric memory cells 27 is a planar array arranged in a matrix format with horizontal rows defined by polysilicon word lines 38a–38h positioned over the substrate 26 and vertical columns defined by channel regions 24a–24g within the substrate 26. Each channel region 24a–24g within the substrate is defined by spaced apart vertical bit line diffusions 22a–22h. Each cell 27 within a column shares the same two bit lines 22 that are adjacent to, and define, the channel region 24 of each cell within the column. Each cell 27 within a row shares the same polysilicon word line 38 with other cells 27 in the row over which the polysilicon word line 38 extends.

Figure 2B:
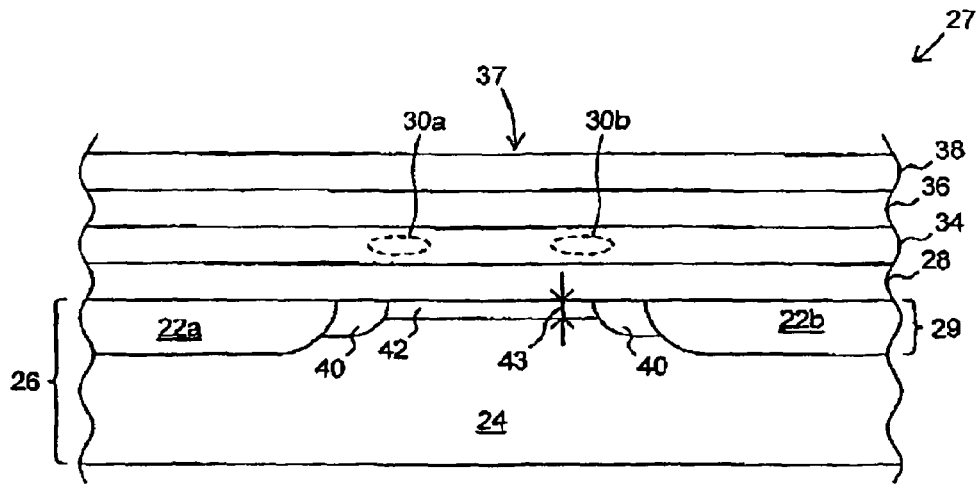
FIG. 2b is a schematic cross sectional view of a dual bit dielectric memory cell in accordance with one embodiment of this invention.

FIG. 2b represents a cross section diagram of a non-volatile memory cell 27 of the array 20. Referring to FIG. 2b in conjunction with the FIG. 2a, it should be appreciated that each polysilicon word line 38a–38h is structured to form a control gate 37 over each memory cell 27 within the row over which the word line extends. Each bit line diffusion 22a–22h is of opposite semiconductor conductivity as each channel region 24a–24g such that each bit line diffusion 22a–22h forms a semiconductor junction with the two channel regions 24 between which the bit line is positioned.

In the exemplary embodiment, each memory cell 27 is an n-mos device. As such, the substrate 26, and each channel region 24, is a p-type semiconductor such as crystalline silicon lightly implanted with a hole donor impurity such as boron. Each bit line diffusion 22 is an n-type semiconductor such as crystalline silicon implanted with arsenic and forms a source region and/or a drain region for each cell that has a channel region 24 that forms a junction with the bit line diffusion 22 (e.g. each call in the two columns of channel regions 24 on the two sides of the bit line diffusion 22). For example, bit line 22*b* forms a source junction with the channel region 24 of each cell that is within the column of channel regions 24*a* and functions as a drain junction for each cell that is within the column of channel regions 24*b*.

The depth of each bit line diffusion 29 extends from the surface of the substrate 26 to bit line depth 29 below the surface. In the exemplary embodiment, the bit line depth may be between 50 angstroms and 3,500 angstroms. A more narrow exemplary bit line depth is between 800 angstroms and 2,500 angstroms.

Above the surface of the substrate 26 and extending over each memory cell 27 within the array of memory cells 20 is a first insulating barrier, or tunnel layer, 28 which may comprise silicon dioxide. The thickness of the tunnel layer 28 may be within a range of about 50 angstroms to about 150 angstroms. An embodiment with a more narrow bracket includes a tunnel layer 28 thickness within a range of about 60 angstroms to about 90 angstroms and even narrower yet, a tunnel layer 28 with a thickness of about 70 angstroms to about 80 angstroms.

Adjacent to the tunnel layer 28, and separated from the surface of the substrate 26 by the tunnel layer 28, is a charge trapping layer 34 that includes a first charge trapping region 30*a* and a second charge trapping region 30*b*, each for storing a neutral charge representing an un-programmed state or a negative charge representing a programmed state. The charge trapping layer 34 may comprise a nitride compound with suitable charge trapping properties and may have a thickness on the order of 20 angstroms to 100 angstroms A narrower range may include a thickness on the order of 30 angstroms to 50 angstroms. The minimum thickness is a thickness such that non-uniformities in the charge trapping layer 34 thickness do not detrimentally effect operation and the thickness is adequate to block hydrogen diffusion. In the exemplary embodiment, the nitride compound may be selected from the group consisting of $Si_3N_4$. $Si_3N_4$ and $SiO_xN_4$.

Above the charge trapping layer 34, and separated from the substrate 26 by both the tunnel layer 28 and the charge trapping layer 34, is a top dielectric layer 36. The top dielectric layer 36 may be silicon dioxide or may be a material with a dielectric constant greater than the dielectric constant of silicon dioxide (e.g. a high K material). In a preferred embodiment, the high K material may be selected from the group of materials consisting of $Al_2O_3$, $HfSi_xO_y$, $HfO_2$, $ZrO_2$, and $ZrSi_xO_y$ and other materials with similarly high dielectric constants. If the top dielectric layer 36 is silicon dioxide, the layer 36 may have a thickness on the order of 60 to 100 angstroms. Alternatively, if the top dielectric layer 36 is a high K material, its electrical thickness may be on the order of 60 angstroms to 100 angstroms while its physical thickness may be within a range of about 70 angstroms to 130 angstroms. An embodiment with a more narrow bracket includes a top dielectric layer 36 with a physical thickness within a range of about 80 angstroms to about 120 angstroms and even narrower yet, a top dielectric layer 36 with a physical thickness of about 90 angstroms to about 100 angstroms.

Above the top dielectric layer 36 is the word line 38 that forms a gate over each memory cell 27 over which the word line 38 is positioned. In the exemplary embodiment, the word line 38 may comprise polysilicon with a thickness on the order of 4,000 angstroms.

Each channel region comprises 24 comprises a central counter doped channel region 42 adjacent to the surface of the substrate 26 and extending into the substrate to a counter doped channel depth 43. In the exemplary embodiment, the central counter doped channel depth 43 may be within a range of about 10 angstroms to about 500 angstroms. An embodiment with a more narrow bracket includes a central counter doped channel depth 43 within a range of about 20 angstroms to about 250 angstroms. And, even narrower yet, a central counter doped channel depth 43 within a range of about 50 angstroms to about 100 angstroms.

The central counter doped channel region 42 laterally extends across only a portion of the length of the entire channel region such that it is spaced apart from each bit line diffusion 22 by a pocket implant 40. The pocket implant 40 includes the same impurity as the channel region 24 such that it is of the same semiconductor type as the channel region 24, which in the exemplary embodiment, is a p-type semiconductor. Each pocket region 40 may extend to a pocket depth within a range of about 500 angstroms to about 2,500 angstroms and include a doping concentration greater than the doping concentration of the channel region 24. The width of the pocket implant 40 between the bit line diffusion 22 and the central counter doped channel region 42 may be within a range of about 300 angstroms to about 500 angstroms.

The central counter doped channel region 42 includes excess free electrons and thereby prevents depletion within the central counter doped channel region 42 even if excessive program and erase cycles of the memory cell 27 leave excessive electrons trapped within a portion of the charge trapping dielectric layer 34 that is between the first charge trapping region 30*a* and the second charge trapping region 30*b*. Such prevention of depletion within the central counter doped channel region 42 reduces the probability of complimentary bit disturbance within the cell 27 even as short channel effects become more pronounced as the channel length of cell 27 (e.g. length of the channel region 24 between the two bit line diffusions 22 on opposing sides of the channel region 24) is scaled smaller.

The array control circuit 29 comprises a word line control circuit 21*a* that couples the array control circuit 29 to each word line 38*a*–38*h* and a bit line control circuit 21*b* that couples the array control circuit 29 to each bit line diffusion 22*a*–22*h*. In operation, the array control circuit 29 operates to selectively couple each word line 38*a*–38*h* and each bit line 22*a*–22*h* to a voltage provided by the voltage divider 25 (or to isolate each word line 38*a*–38*h* and each bit line 22*a*–22*h* from all voltage sources and ground such that is potential is effected only by electrical interaction with other structure of the array 20). The array control circuit 29 also operates to couple a selected bit line 22 to the current sensor 23 such that a current on the selected bit line 22 may be measured to indicate the programmed state of a selected charge trapping region 30 of a cell within a column of cells in which such selected bit line 22 is either a source or a drain. The selective coupling of such word lines 38*a*–38*h* and such bit lines 22*a*–22*h* to voltages, ground, and the current sensor 23 is in such a manner that each charge trapping region 30 of each cell 27 within the array 20 may be erased, selectively programmed, and selectively read.

The voltage divider 25 may comprise a coupling to a positive operating power source (Vc) 46*a*, a coupling to a negative operating power source (–Vc) 46*b*, and a coupling to a ground 48. The voltage divider 25 comprises circuits for providing applicable positive voltages and negative voltages to the array control circuit 29 for performing such erasure, selective programming, and selective reading of charge trapping regions 30 of cells 27 within the array 20.

The current sensor 23 may utilize known circuits for sensing current on the selected bit line 22 that is coupled to the current sensor 23 by the bit line control circuit 21b. The current sensed represents the programmed state of a selected one of the charge trapping regions 30 when applicable potentials are coupled to applicable word lines 38a–38h bit lines 22a–22h by the array control circuit 29 for reading the selected charge trapping region 30 as described in more detail herein.

Programming State

When the array control circuit 29 is operating in a program state, a charge trapping region 30 is selectively programmed by injecting electrons into such charge trapping region 30 using a hot electron injection technique. More specifically, the array control circuit 29 couples bit lines 22a–22h and the word lines 38a–38h to various potentials provided by the voltage divider 25 to apply a high drain-to-source bias while applying a high voltage to the word line 38 that forms a control gate over the charge trapping region 30. For example, programming of charge trapping region 30b may be accomplished by the array control circuit 29 coupling the bit line 22a to ground, coupling bit line 22b to a positive programming voltage from the voltage divider 25 of approximately 5 volts, and coupling the word line 38 that is positioned over the cell 27 to a word line programming voltage from the voltage divider 25 of approximately 10 volts. The word lines other than the word line 38 over the selected cell 27 (e.g. non-selected word lines) may be coupled to ground or a small negative bias voltage to prevent punch-through current leakage through non-selected memory cells that share the same column as the selected memory cell 27.

The voltage on the control gate 38 inverts the channel region 24 while the high drain-to-source bias draws and accelerates electrons from the source region 22a into the channel region 24 towards the drain region 22b. The 4.5 eV to 5 eV kinetic energy gain of the electrons is more than sufficient to surmount the 3.1 eV to 3.5 eV energy barrier at the polysilicon/oxide interface at the surface of the substrate 26 and, while the electrons are accelerated towards drain region 22b, the field caused by the high voltage on control gate 38 redirects the electrons towards the charge trapping region 30b.

Erase State

When the array control circuit 29 is operating in an erase state, a all charge trapping regions 30 within the array 20 are erased using either a hot hole injection technique or by tunneling the electrons from the charge trapping layer 34 to the gate 38 or to the substrate 26. Both techniques are known in the art.

Read State

When the array control circuit 29 is operating in a read state, the presence of trapped electrons (e.g a negative charge representing a programmed state) in a selected charge trapping region 30 is detected. It is recognized that the presence of trapped electrons within a charge trapping region 30 will effect accumulation within the pocket region 40 below such charge trapping region 30. As such, the presence of trapped electrons in a charge trapping region 30 will effect the threshold voltage of a field effect transistor (FET) characterized by the control gate 38, the bit line diffusion 22 directly below the charge trapping region 30 that functions as a source region, and the bit line diffusion 22 on the opposing side of the channel region 24 that functions as a drain region. Therefore, the presence of a stored charge in the charge trapping region 30 may be detected by operation of the FET.

For example, the presence of electrons stored within the first charge trapping region 30b may be detected by applying a positive voltage to the control gate 38 and a lesser positive voltage to the bit line 22a while the bit line 22b is grounded. The current flow is then measured at either bit line 22a or 22b. Assuming proper voltages and thresholds for measurement (and assuming no current leakage from adjacent memory cells within the same row as the selected cell and assuming no current leakage from memory cells within the same column as the selected cell) if there are electrons trapped within the first charge trapping region 30b, no measurable current will be detected. Otherwise, if the first charge trapping region 30b is charge neutral (e.g., no trapped electrons) then there will be a measurable current flow. Similarly, the presence of electrons stored within the second charge trapping region 30a may be detected by the same method, and merely reversing the voltages applied to the two bit lines 22a and 22b.

Fabrication

Figure 3:
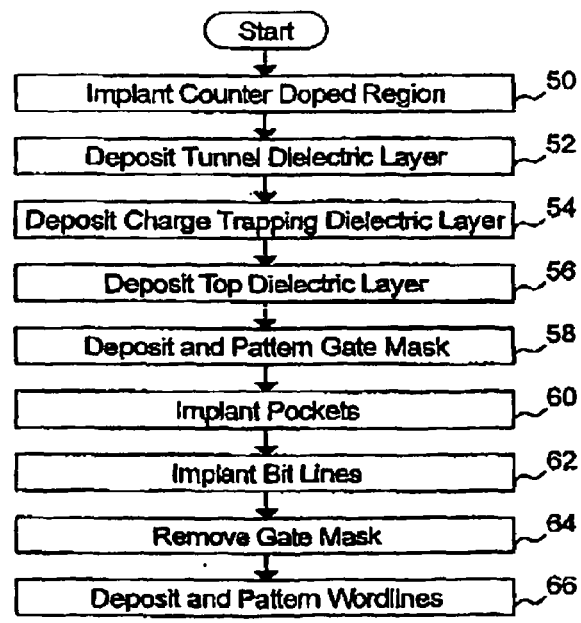

FIG. 3 is a flow chart that represents an exemplary process for fabricating a dual bit dielectric memory cell 27 and FIGS. 4a through 4g represent the memory cell 27 at various stages of Fabrication. Those skilled in the art will recognize that the below described steps provide for the structure of the memory cell 27 and that additional steps may be added to the below described steps for fabrication of field effect transistors for periphery circuit logic.

Figure 4A:
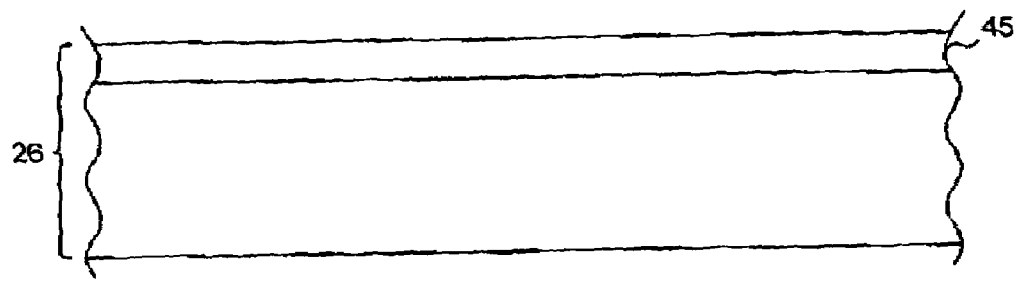
FIG. 4a is a schematic cross sectional view of a processing step in the fabrication of the dual bit dielectric memory cell of FIG. 2b.

Referring to FIG. 3, step 50 represents implanting a counter doped layer 45 into a p-type semiconductor substrate 26 as is shown in FIG. 4a. The counter doped layer 45 will become the central counter doped channel region 42 of each cell 27. The depth of the implant of step 50 will be the counter doped channel region depth 43. In the exemplary fabrication process, the step 50 may comprise implanting the substrate 36 with arsenic at a does between $1 \times 10^{12}$ and $1 \times 10^{13}$ atoms per square centimeter with an implant energy of 10 Kev to 40 KeV.

Figure 4B:
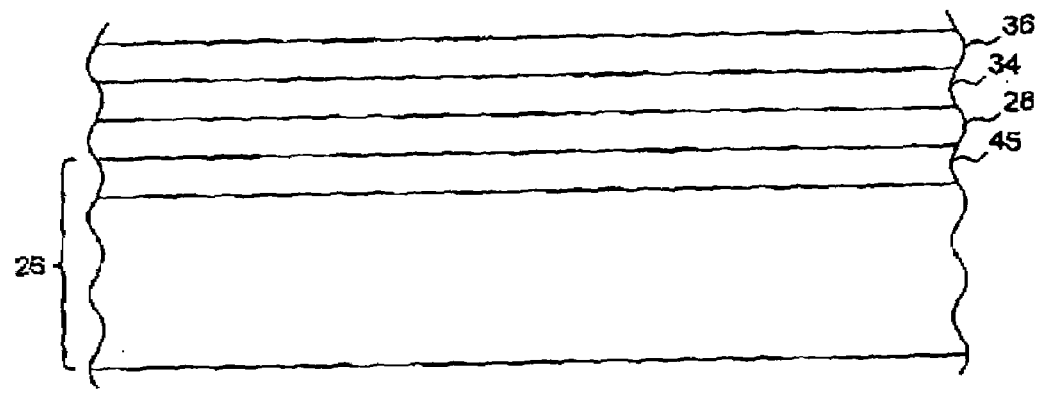
FIG. 4b is a schematic cross sectional view of a processing step in the fabrication of the dual bit dielectric memory cell of FIG. 2b.

Step 52 represents growing or depositing the tunnel dielectric layer 28 on the surface of the substrate 26, step 54 represents depositing the charge trapping layer 34 on the surface of the tunnel dielectric layer 28, and step 56 represents depositing the tope dielectric layer 36 on the surface of the charge trapping layer, all as shown in FIG. 4b.

Figure 4C:
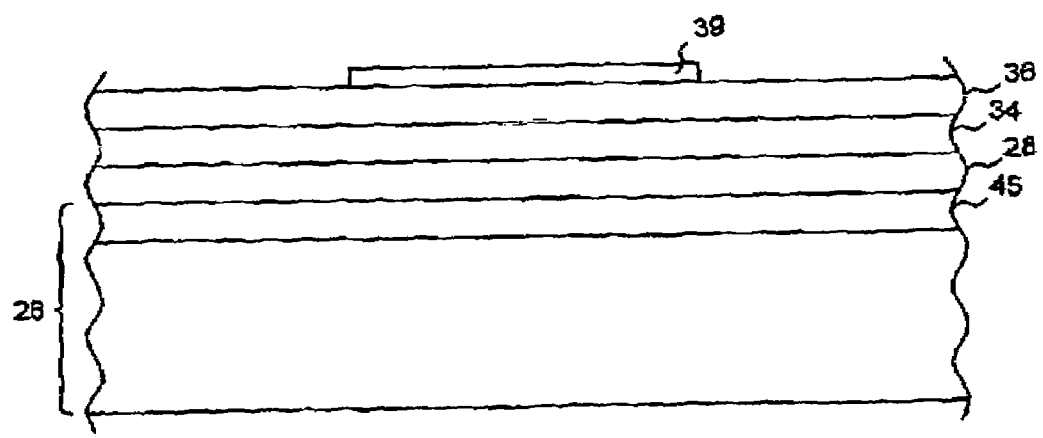
FIG. 4c is a schematic cross sectional view of a processing step in the fabrication of the dual bit dielectric memory cell of FIG. 2b.

Step 58 depositing and patterning a gate mask 39 on the surface of the top dielectric layer 36 and patterning the gate mask 39 such that it masks the channel region of each memory cell 28 and exposes each bit line 22a–22h as shown in FIG. 4c.

Figure 4D:
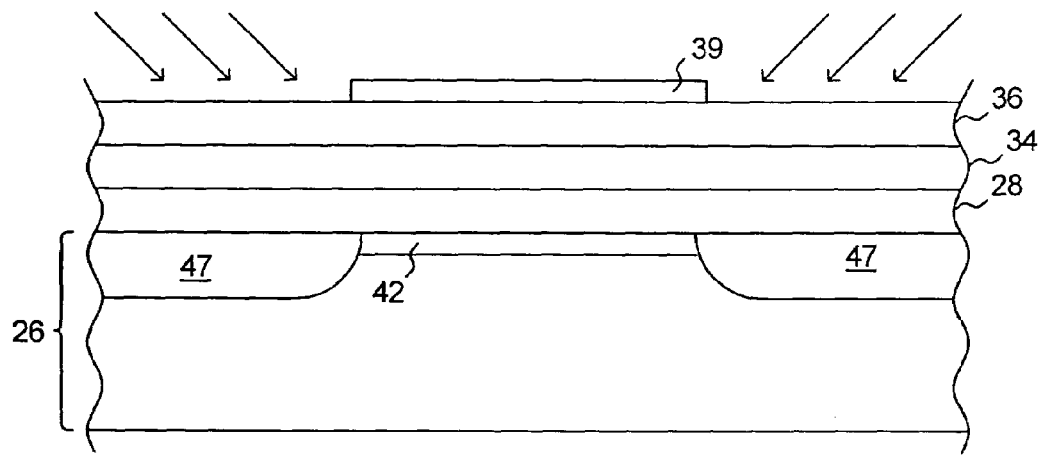
FIG. 4d is a schematic cross sectional view of a processing step in the fabrication of the dual bit dielectric memory cell of FIG. 2b.

Step 60 represents implanting a pocket layer 47 to define the central counter doped channel region 42 beneath the gate 38 as is shown in FIG. 4d. More specifically, the implant may be a boron (or other hole donor impurity) with a dose between $5 \times 10^{12}$ and $5 \times 10^{13}$ atoms per square centimeter with an implant energy between 20 and 40 KeV. To assure that the pocket layer 47 extends beneath the word lines 38 (which effectively mask the channel region of each memory cell 27), the implant may be performed at a tilt angle between 5 and 35 degrees from vertical (and at a tile angle between −5 and −35 degrees from vertical to assure that the implant extends beneath both sides of the word line).

Figure 4E:
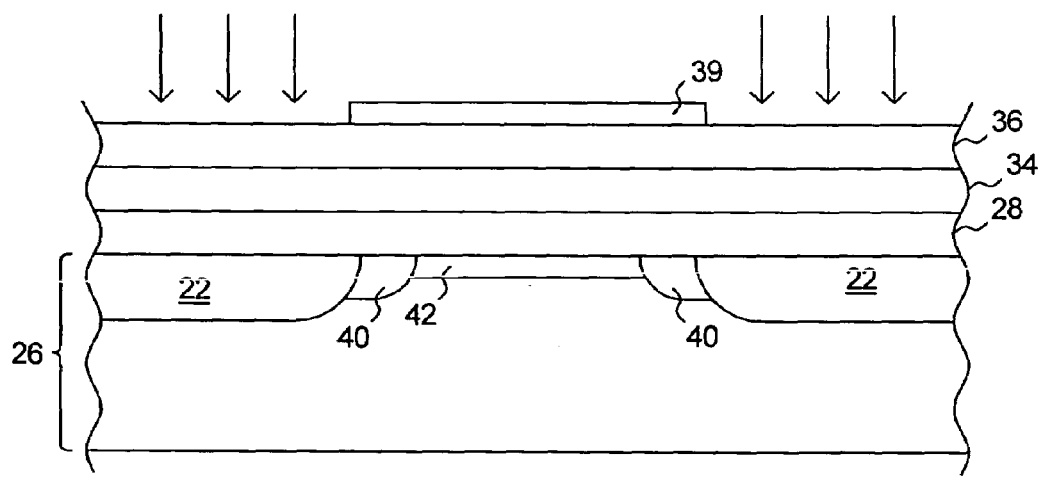
FIG. 4e is a schematic cross sectional view of a processing step in the fabrication of the dual bit dielectric memory cell of FIG. 2b.

Step 62 represents implanting the bit lines 22 thereby defining the bit lines 22 and the pocket regions 40 as shown in FIG. 4e. More specifically, the implant may be arsenic (or other electron donor impurity) with a dose between $4\times10^{14}$ and $3\times10^{15}$ atoms per square centimeter and with an implant energy between 40 and 100 KeV. Implant of the bit lines 22 is performed without significant tilt from vertical such that pocket regions 40 are defined.

Figure 4F:
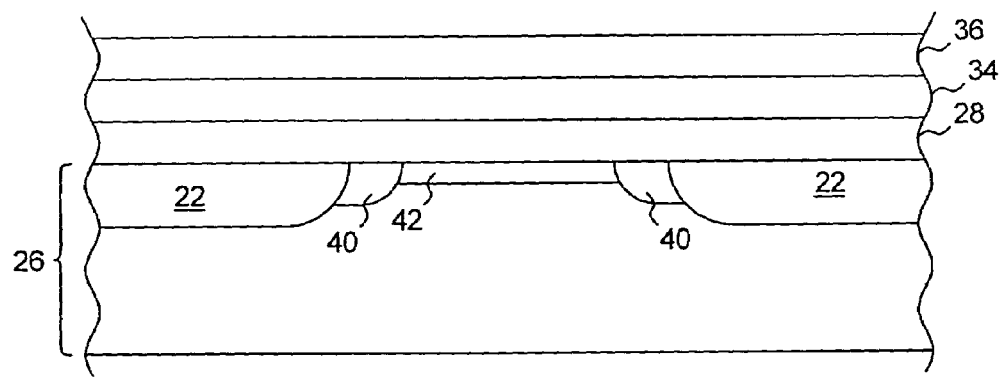
FIG. 4f is a schematic cross sectional view of a processing step in the fabrication of the dual bit dielectric memory cell of FIG. 2b.
Figure 4G:
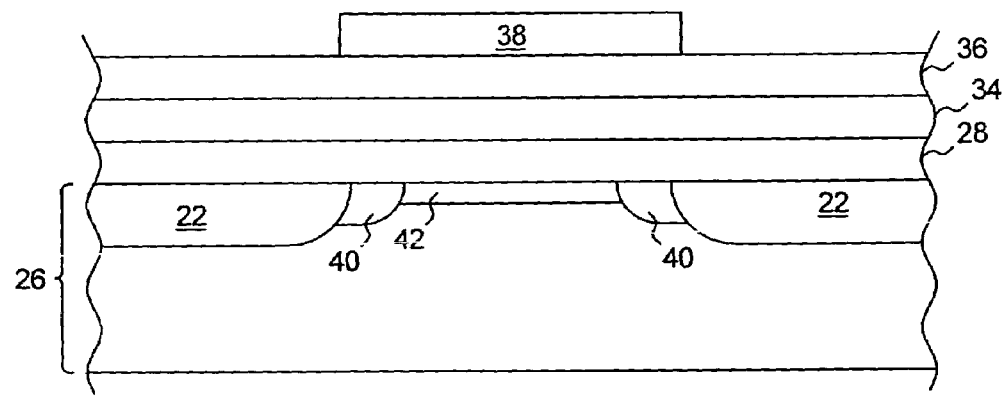
FIG. 4g is a schematic cross sectional view of a final processing step in the fabrication of the dual bit dielectric memory cell of FIG. 2b.

Step 64 represent removing the gate mask 39 as is shown in FIG. 4f. Step 66 represents depositing a layer of polysilicon on the surface of the top dielectric layer 36. The polysilicon layer is patterned and etched using known photolithography techniques to form the word lines word lines 38 as is shown in FIG. 4g.

In summary, the teachings of this invention provides for fabrication of a smaller cell without exacerbating complimentary bit disturb effects. Although the dielectric memory cell of this invention has been shown and described with respect to certain preferred embodiments, it is obvious that equivalents and modifications will occur to others skilled in the art upon the reading and understanding of the specification. For example, the exemplary embodiments describe a planar dual bit dielectric memory cell array formed on a crystalline silicon p-type wafer. However, it should be appreciated that the teachings of this invention may be applied to both planar, fin formed, and other dielectric memory cell structures which may be formed on any suitable semiconductor substrate. The present invention includes all such equivalents and modifications, and is limited only by the scope of the following claims.

What is claimed is:

1. A dual bit dielectric memory cell array comprising:
    a) a lightly doped substrate of P type conductivity;
    b) a plurality of parallel bit lines implanted to a bit line depth within the lightly doped substrate, each of the plurality of parallel bit lines of N type conductivity and defining a plurality of channel regions of P type conductivity spaced there between and each interface between a bit line and a channel region being a semiconductor junction;
    c) a charge trapping dielectric on the top surface of the substrate, the charge trapping dielectric including at least one charge trapping region disposed at least partially above each channel region and below a control gate corresponding to the channel region; and wherein
    d) each channel region comprising a central counter doped channel region of N type conductivity and extending from a top surface of the substrate into the channel region to a depth less than the bit line depth and being spaced from each semiconductor junction, wherein the counter doped channel region is spaced from each semiconductor junction by a pocket region of P type conductivity.

2. The dual bit dielectric memory cell array of claim 1, wherein the charge trapping dielectric comprises a tunnel layer of a first dielectric material, a charge trapping layer comprising a dielectric material with charge trapping properties, and a top dielectric of a second dielectric material, the tunnel layer being adjacent to the top surface of the substrate, the charge trapping layer being adjacent to the tunnel layer and spaced from the top surface of the substrate by the tunnel layer, and the top layer being adjacent to the charge trapping layer and spaced from the top surface of the substrate by both the tunnel layer and the charge trapping layer.

3. The dual bit dielectric memory cell array of claim 2, wherein the charge trapping dielectric extends across the entire surface of the dielectric memory cell array over both each bit line and each channel region.

4. The dual bit dielectric memory cell array of claim 1, wherein the pocket region has a doping concentration greater than the doping concentration of the lightly doped substrate.

5. The dual bit dielectric memory cell array of claim 3, further comprising a plurality of parallel word lines on the surface of the top layer, the plurality of parallel word lines being perpendicularly positioned with respect to the bit lines, and wherein the word lines form the respective control gates.

6. The dual bit dielectric memory cell array of claim 5, wherein the wherein charge trapping layer comprises of a nitride compound with a thickness range from about 20 angstroms to 100 angstroms in thickness.

7. The dual bit dielectric memory cell of claim 1, wherein the charge trapping layer comprises a material selected from the group consisting of $Si_3N_4$ and $SiO_xN_4$.

8. A dual bit dielectric memory cell comprising:
    a) a semiconductor substrate comprising:
        i) a channel region lightly implanted with P type impurity; and
        ii) a source region and drain region implanted to a bit line depth with N type impurity and positioned on opposing sides of the channel region and each forming a semiconductor junction with the channel region;
    b) a charge trapping dielectric positioned on the surface of the substrate; and wherein
    c) wherein the channel region comprises a central counter doped channel region with N type conductivity and extending from a top surface of the substrate into the channel region to a depth less than the bit line depth and being spaced from each semiconductor junction, and the central counter doped channel region includes excess free electrons, wherein the counter doped channel region is spaced from each semiconductor junction by a pocket region of P type conductivity.

9. The dual bit dielectric memory cell of claim 8, wherein the charge trapping dielectric comprises a tunnel layer of a first dielectric material, a charge trapping layer comprising a dielectric material with charge trapping properties, and a top dielectric of a second dielectric material, the tunnel layer being adjacent to the top surface of the substrate, the charge trapping layer being adjacent to the tunnel layer and spaced from the top surface of the substrate by the tunnel layer, and the top layer being adjacent to the charge trapping layer and spaced from the top surface of the substrate by both the tunnel layer and the charge trapping layer.

10. The dual bit dielectric memory cell of claim 9, wherein the charge trapping dielectric extends across the entire surface of the dielectric memory cell over each of the source region, the drain region, and the channel region.

11. The dual bit dielectric memory cell of claim 9, further comprising a control gate on the surface of the top layer, and wherein the charge trapping layer includes at least one charge trapping region disposed at least partially above the channel region and below the control gate.

12. The dual bit dielectric memory cell of claim 11, wherein the wherein charge trapping layer comprises of a nitride compound with a thickness range from about 20 angstroms to 100 angstroms in thickness.

13. The dual bit dielectric memory cell of claim 12, wherein the charge trapping layer comprises a material selected from the group consisting of $Si_3N_4$ and $SiO_xN_4$.

14. A charge trapping dielectric memory cell array comprising:
    a) a lightly doped substrate of P type conductivity;

b) a plurality of parallel bit lines implanted to a bit line depth within the lightly doped substrate, each of the plurality of parallel bit lines being of N type conductivity and defining a plurality of channel regions of P type conductivity spaced there between and each interface between a bit line and a channel region being a semiconductor junction;

c) a plurality of parallel and spaced apart word lines positioned above the surface of the substrate and separated from the substrate by a charge trapping dielectric, the plurality of parallel word lines being perpendicularly positioned with respect to the bit lines and each channel region having a corresponding control gate formed from one of the word lines, and the charge trapping dielectric including at least one charge trapping region disposed at least partially above each channel region and below the control gate corresponding to the channel region; and wherein d) each channel region comprises a central counter doped channel region of N type conductivity and extending from a top surface of the substrate into the channel region to a depth less than the bit line depth and being spaced from each semiconductor junction, wherein the counter doped channel region is spaced from each semiconductor junction by a pocket region of P type conductivity.

15. The charge trapping dielectric memory cell array of claim 14, wherein the charge trapping dielectric comprises a tunnel layer of a first dielectric material, a charge trapping layer comprising a dielectric material with charge trapping properties, and a top dielectric of a second dielectric material, the tunnel layer being adjacent to the top surface of the substrate, the charge trapping layer being adjacent to the tunnel layer and spaced from the top surface of the substrate by the tunnel layer, and the top layer being adjacent to the charge trapping layer and the word lines and spaced from the top surface of the substrate by both the tunnel layer and the charge trapping layer.

16. The charge trapping dielectric memory cell array of claim 15, wherein the charge trapping dielectric extends across the entire surface of the dielectric memory cell array over both each bit line and each channel region.

17. The charge trapping dielectric memory cell array of claim 14, wherein the pocket region has a doping concentration greater than the doping concentration of the lightly doped substrate.

18. The charge trapping dielectric memory cell array of claim 15, wherein the wherein charge trapping layer comprises of a nitride compound with a thickness range from about 20 angstroms to 100 angstroms in thickness.

19. The charge trapping dielectric memory cell array of claim 18, wherein the charge trapping layer comprises a material selected from the group consisting of $Si_2N_4$ and $SiO_xN_4$.

20. A dual bit dielectric memory cell array comprising:

a) a lightly doped substrate of P type conductivity;

b) a plurality of parallel bit lines having a bit line depth within the lightly doped substrate and defining a plurality of channel regions of P type conductivity;

c) a charge trapping dielectric over the top surface of the substrate, the charge trapping dielectric including at least one charge trapping region disposed at least partially above each channel region and below a control gate corresponding to the channel region; and wherein d) each channel region includes a central counter doped channel region of N type conductivity that extends from a top surface of the substrate into the channel region to a depth less than the bit line depth and is spaced from each adjacent bit line by a pocket region of P type conductivity.

* * * * *